United States Patent
Pi et al.

(10) Patent No.: US 12,096,639 B2
(45) Date of Patent: Sep. 17, 2024

(54) MAGNETIC MEMORY DEVICE

(71) Applicant: SAMSUNG ELECTRONICS CO., LTD., Suwon-si (KR)

(72) Inventors: Ung Hwan Pi, Hwaseong-si (KR); Sung Chul Lee, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 17/483,156

(22) Filed: Sep. 23, 2021

(65) Prior Publication Data

US 2022/0216266 A1 Jul. 7, 2022

(30) Foreign Application Priority Data

Jan. 4, 2021 (KR) .................. 10-2021-0000345

(51) Int. Cl.
| | |
|---|---|
| H01L 27/22 | (2006.01) |
| G11C 11/16 | (2006.01) |
| H01L 43/02 | (2006.01) |
| H10B 61/00 | (2023.01) |
| H10N 50/80 | (2023.01) |
| H10N 50/85 | (2023.01) |

(52) U.S. Cl.
CPC ............ *H10B 61/22* (2023.02); *G11C 11/161* (2013.01); *H10N 50/80* (2023.02); *G11C 11/165* (2013.01); *H10N 50/85* (2023.02)

(58) Field of Classification Search
CPC .................................................. G11C 11/161
See application file for complete search history.

(56) References Cited

U.S. PATENT DOCUMENTS

| | | |
|---|---|---|
| 6,765,823 B1 | 7/2004 | Zhu et al. |
| 6,917,087 B2 | 7/2005 | Chen |
| 8,379,429 B2 | 2/2013 | Ishiwata et al. |
| 8,477,528 B2 | 7/2013 | Honda et al. |
| 10,062,449 B2 | 8/2018 | Choe |
| 10,600,461 B2 | 3/2020 | Shibata |
| 2003/0147289 A1* | 8/2003 | Saito .................. G11C 11/5607 365/200 |

FOREIGN PATENT DOCUMENTS

JP 2015-095632 5/2015

* cited by examiner

*Primary Examiner* — John A Bodnar
(74) *Attorney, Agent, or Firm* — F. Chau & Associates, LLC

(57) ABSTRACT

A magnetic memory device includes a first magnetic memory cell extending in a first direction and including a first magnetic domain and a second magnetic domain arranged in the first direction, and a second magnetic memory cell extending in the first direction and including a third magnetic domain and a fourth magnetic domain arranged in the first direction. A magnetization direction of the first magnetic domain and a magnetization direction of the second magnetic domain are anti-parallel to each other. A magnetization direction of the third magnetic domain and a magnetization direction of the fourth magnetic domain are anti-parallel to each other. The third magnetic domain of the second magnetic memory cell is spaced apart from the second magnetic domain of the first magnetic memory cell in a second direction intersecting the first direction.

20 Claims, 20 Drawing Sheets

MAGNETIC MEMORY DEVICE

CROSS-REFERENCE TO RELATED APPLICATION

This U. S non-provisional patent application claims priority under 35 U.S.C. § 119 to Korean Patent Application No. 10-2021-0000345 filed on Jan. 4, 2021 in the Korean Intellectual Property Office, the disclosure of which is incorporated by reference in its entirety herein.

1. Technical Field

The present disclosure relates to a magnetic memory device. More specifically, the present disclosure relates to a magnetic memory device that utilizes a movement phenomenon of a magnetic domain wall.

2. Discussion of Related Art

A nonvolatile memory is a storage device that retains stored information even after power is removed. Examples of nonvolatile memory include flash memory, read-only memory (ROM), ferroelectric random access memory (RAM), and resistive nonvolatile memory including a resistive material.

Examples of resistive nonvolatile memory include Phase Change Random Access Memory (PRAM), Resistive RAM (RRAM), and Magnetic RAM (MRAM). A flash memory device stores data using a charge, whereas a nonvolatile memory device that uses the resistance material stores data, using a state change (PRAM) of a phase change material such as a chalcogenide alloy, and a resistance change (RRAM) of a variable resistance material, a resistance change (MRAM) of a Magnetic Tunnel Junction (MTJ) thin film according to a magnetization state of a ferromagnetic material.

The MRAM has high read and write speeds, high durability, and low power consumption while an operation is performed. Further, the MRAM may also store information using a magnetic material as an information-storage medium.

SUMMARY

At least one embodiment of the present disclosure provides a magnetic memory device having increased reliability.

According to an embodiment of the present disclosure, a magnetic memory device includes a first magnetic memory cell and a second magnetic memory cell. The first magnetic memory cell extends in a first direction, and includes a first magnetic domain and a second magnetic domain arranged in the first direction. The second magnetic memory cell extends in the first direction, and includes a third magnetic domain and a fourth magnetic domain arranged in the first direction. A magnetization direction of the first magnetic domain and a magnetization direction of the second magnetic domain are anti-parallel to each other. A magnetization direction of the third magnetic domain and a magnetization direction of the fourth magnetic domain are anti-parallel to each other. The third magnetic domain of the second magnetic memory cell is spaced apart from the second magnetic domain of the first magnetic memory cell in a second direction intersecting the first direction.

According to an embodiment of the present disclosure, a magnetic memory device including a first word line, a second word line, a first bit line, and a first magnetic memory cell. The first word line extends in a first direction. The second word line is spaced apart from the first word line in a second direction intersecting the first direction, and extends in the first direction. The first bit line intersects the first word line and the second word line, and extends in a third direction which forms a first acute angle with the first direction and forms a second acute angle with the second direction. The first magnetic memory cell is connected to the first word line, the second word line, and the first bit line. The first magnetic memory cell includes a first magnetic layer arranged in the first direction, and includes a first magnetic domain and a second magnetic domain having magnetization directions anti-parallel with each other, and a first pinned layer disposed on the first magnetic layer. The first magnetic domain is connected to the first word line through a first transistor, the second magnetic domain is connected to the first bit line, and the first pinned layer is connected to the second word line through a second transistor.

According to an embodiment of the present disclosure, a magnetic memory device includes a magnetic layer and a pinned layer. The magnetic layer extends in a first direction and includes a first sub-magnetic layer and a second sub-magnetic layer sequentially stacked, and a pinned layer disposed on the magnetic layer. The first sub-magnetic layer includes a first magnetic domain and a second magnetic domain arranged in the first direction, the second sub-magnetic layer includes a third magnetic domain and a fourth magnetic domain arranged in the first direction, and a Dzyaloshinskii-moriya interaction (DMI) of the magnetic layer is 0.1 erg/cm2 or more.

According to an embodiment of the present disclosure, a magnetic memory device includes a plurality of memory cells extending in a direction, where each of the magnetic memory cells includes a first magnetic domain and a second magnetic domain arranged in the direction. A magnetization direction of the first magnetic domain and a magnetization direction of the second magnetic domain are anti-parallel to each other. The magnetization direction of the second magnetic domain of a given one of the magnetic memory cells is anti-parallel to the first magnetic domain of three of the magnetic memory cells that are adjacent and surround the given magnetic memory cell.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

Hereinafter, embodiments of the present disclosure will be described referring to the accompanying drawings.

An electronic device 1 including a nonvolatile memory 200 will be described below referring to FIGS. 1 and 2.

Figure 1:
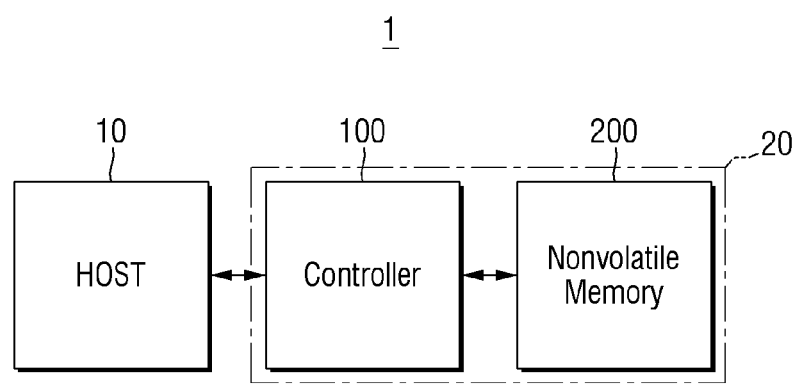
FIG. 1 is a block diagram for explaining an electronic device according to an embodiment of the inventive concept.

FIG. 1 is a block diagram for explaining an electronic device according to an embodiment of the inventive concept. FIG. 2 is a block diagram for explaining the nonvolatile memory of FIG. 1.

Referring to FIG. 1, the electronic device 1 may include a host 10 and a memory device 20.

In an embodiment, the host 10 may be connected to the memory device 20 through an interface. For example, the host 10 may transmit a signal to the memory device 20 to control the memory device 20. Further, for example, the host 10 may receive a signal from the memory device 20 and process the data included in the signal.

For example, the host 10 may include a central processing unit (CPU), a controller or an application specific integrated circuit (ASIC). Further, for example, the host 10 may include a memory chip such as a Dynamic Random Access Memory (DRAM), a Static RAM (SRAM), a Phase-change RAM (PRAM), a Magneto resistive RAM (MRAM), a Ferroelectric RAM (ReRAM), and a Resistive RAM (RRAM).

The memory device 20 may include a controller 100 and a nonvolatile memory 200. For example, the nonvolatile memory 200 may include a magnetic random access memory (MRAM), a phase-change RAM (PRAM), and a Resistive RAM (RRAM). However, embodiments of the present disclosure are not limited thereto. The nonvolatile memory 200 is not limited to the resistive memory, and may include various nonvolatile memories such as an Electrically Erasable and Programmable ROM (EPROM), a flash memory, and a Ferroelectric RAM (FRAM).

The controller 100 (e.g., a control circuit) and the nonvolatile memory 200 may be connected through an interface. The controller 100 may access the nonvolatile memory 200. For example, the controller 100 may control read, write, and erase operations of the nonvolatile memory 200. The controller 100 may act as an interface between the host 10 and the nonvolatile memory 200. The controller 100 may drive or execute a firmware for controlling the nonvolatile memory 200.

The interface between the host 10 and the memory device 20 may include, for example, various communication standards, such as a Universal Serial Bus (USB), a multimedia card (MMC), a peripheral component interconnection (PCI), a PCI-express (PCI-E), an Advanced Technology Attachment (ATA), a Serial-ATA, a Parallel-ATA, a small computer small interface (SCSI), an enhanced small disk interface (ESDI), an Integrated Drive Electronics (IDE), and Firewire.

The memory device 20 may include a personal computer (PC) memory card international association (PCMCIA), a compact flash card (CF), a smart media card (SM, SMC), a memory stick, a multimedia card (MMC, RS-MMC, MMC-micro), a SD card (SD, miniSD, microSD, SDHC), and a universal flash storage (UFS). Further, the memory device 20 may include a solid state drive SSD integrated into a single semiconductor device.

Figure 2:
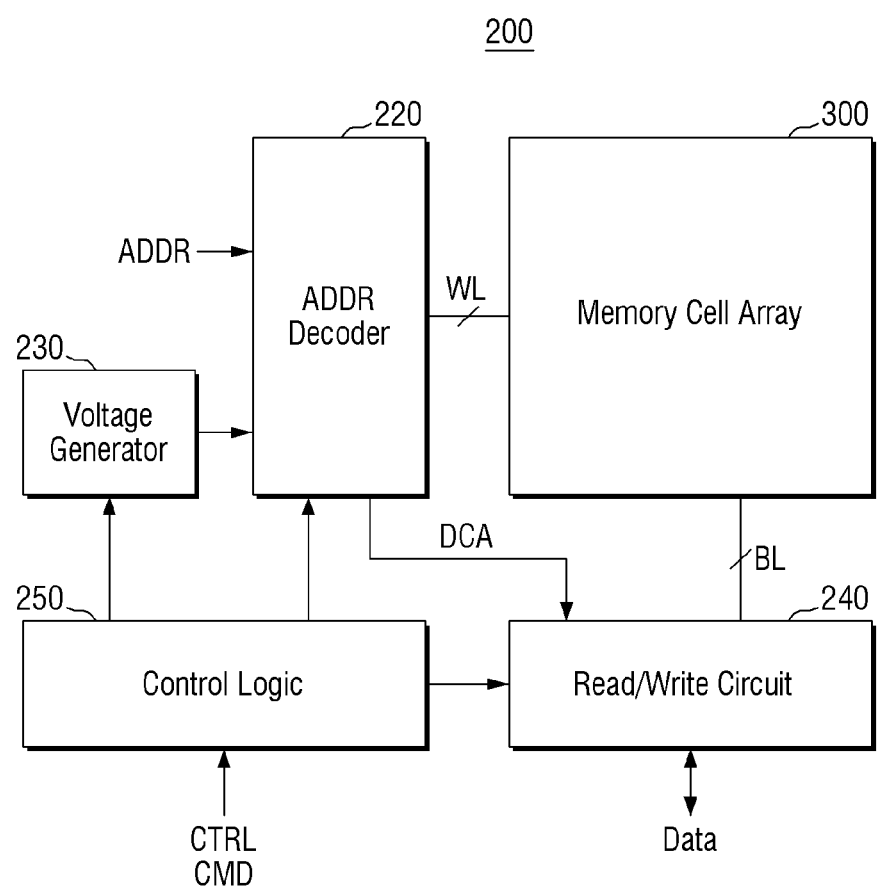
FIG. 2 is a block diagram for explaining the nonvolatile memory of FIG. 1.

Referring to FIG. 2, the nonvolatile memory 200 includes a memory cell array 300, an address (ADDR) decoder 220 (e.g., a decoder circuit), a voltage generator 230, a read/write circuit 240, and control logic 250 (e.g., a logic circuit).

The memory cell array 300 may be connected to the address decoder 220 through word lines WL. The memory cell array 300 may be connected to the read/write circuit 240 through bit lines BL. The memory cell array 300 may include a plurality of memory cells. For example, the memory cells arranged in a row direction may be connected to a word line WL. For example, the memory cells arranged in a column direction may be connected to a bit line BL. Here, a word line WL may include a read word line or a write word line, and a bit line BL may include a bit line or a sensing line.

The address decoder 220 may be connected to the memory cell array 300 through the word lines WL. The address decoder 220 may operate in response to the control of the control logic 250. The address decoder 220 may receive an address ADDR from the controller 100. The address decoder 220 may receive a voltage required for the operation such as a program operation and a read operation from the voltage generator 230.

The address decoder 220 may decode a row address in the received address ADDR. The address decoder 220 may select the word line WL, using the decoded row address. A decoded column address DCA may be provided to the read/write circuit 240. For example, the address decoder 220 may include a row decoder, a column decoder, an address buffer, and the like.

The voltage generator 230 may generate a voltage required for an access operation (e.g., a read, a program operation, an erase operation, etc.) under the control of the control logic 250. For example, the voltage generator 230 may generate a program voltage and a program verification voltage required to perform the program operation. For example, the voltage generator 230 may generate the read voltages required to perform the read operation, and may generate the erase voltage and the erase verification voltage required to perform the erase operation. Further, the voltage generator 230 may also provide the address decoder 220 with the voltage required to perform each operation.

The read/write circuit 240 may be connected to the memory cell array 300 through the bit lines BL. The read/write circuit 240 may send and receive data to and from the controller 100. The read/write circuit 240 may operate in response to the control of the control logic 250. The read/write circuit 240 may receive the decoded column address DCA from the address decoder 220. The read/write circuit 240 may select a bit line BL, using the decoded column address DCA.

For example, the read/write circuit 240 may program the received data Data into the memory cell array 300. The read/write circuit 240 may read the data from the memory cell array 300 and provide the read data to the outside (e.g., the controller 100). For example, the read/write circuit 240 may include configurations such as a detection amplifier, a write driver, a column selection circuit, and a page buffer.

The control logic 250 may be connected to the address decoder 220, the voltage generator 230, and the read/write circuit 240. The control logic 250 may control the operation of the nonvolatile memory 200. The control logic 250 may operate in response to a control signal CRTL and a command CMD (e.g., a write command, a read command, etc.) provided from the controller 100.

Figure 3:
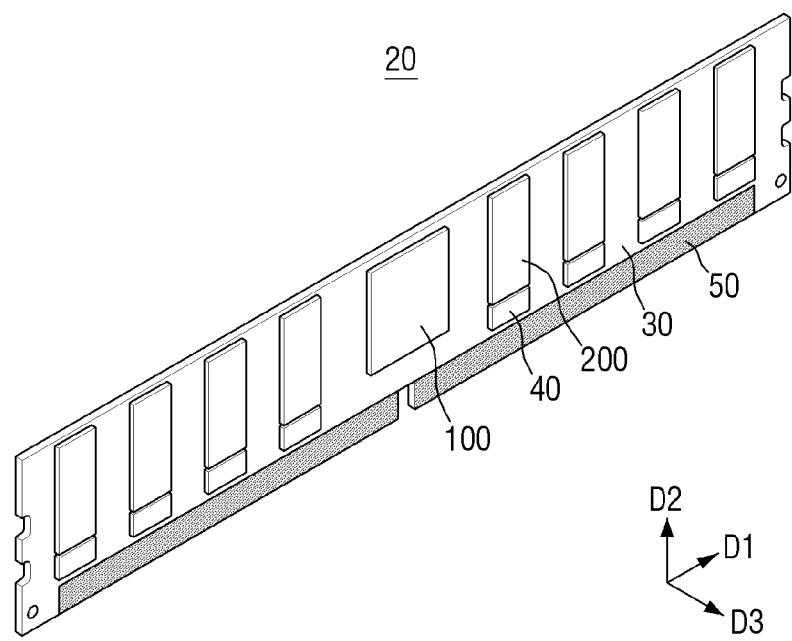
FIG. 3 is a perspective view showing a memory device according to an embodiment of the inventive concept.

FIG. 3 is a perspective view showing a memory device according to an embodiment of the inventive concept.

Referring to FIG. 3, the memory device 20 includes a printed circuit board 30, a plurality of nonvolatile memories 200, a buffer 40 (e.g., a buffer circuit), a connector 50, and a controller 100.

A plurality of nonvolatile memories 200 may be coupled on the printed circuit board 30. The connector 50 may be electrically connected to a plurality of nonvolatile memories 200 through a conductive line. The connector 50 is configured to connect to a slot of the host 10 and may connect the plurality of nonvolatile memories 200 and the host 10. The controller 100 is connected to the plurality of nonvolatile memories 200 through the buffer 40, and may control the plurality of nonvolatile memories 200.

The memory device 20 may extend in a first direction D1 and a second direction D2. That is, the memory device 20 may include a printed circuit board 30 that extends in the first direction D1 and the second direction D2. For example, the width of the memory device 20 in the first direction D1 may be larger than the height of the memory device 20 in the second direction D2. The plurality of nonvolatile memories 200 may be placed on the printed circuit board 30. The nonvolatile memory 200 may be formed to extend longer in the first direction D1 than in the second direction D2. For example, the memory cell array 300 of the nonvolatile memory 200 of FIG. 2 may be formed to extend longer in the first direction D1 than in the second direction D2.

Figure 4:
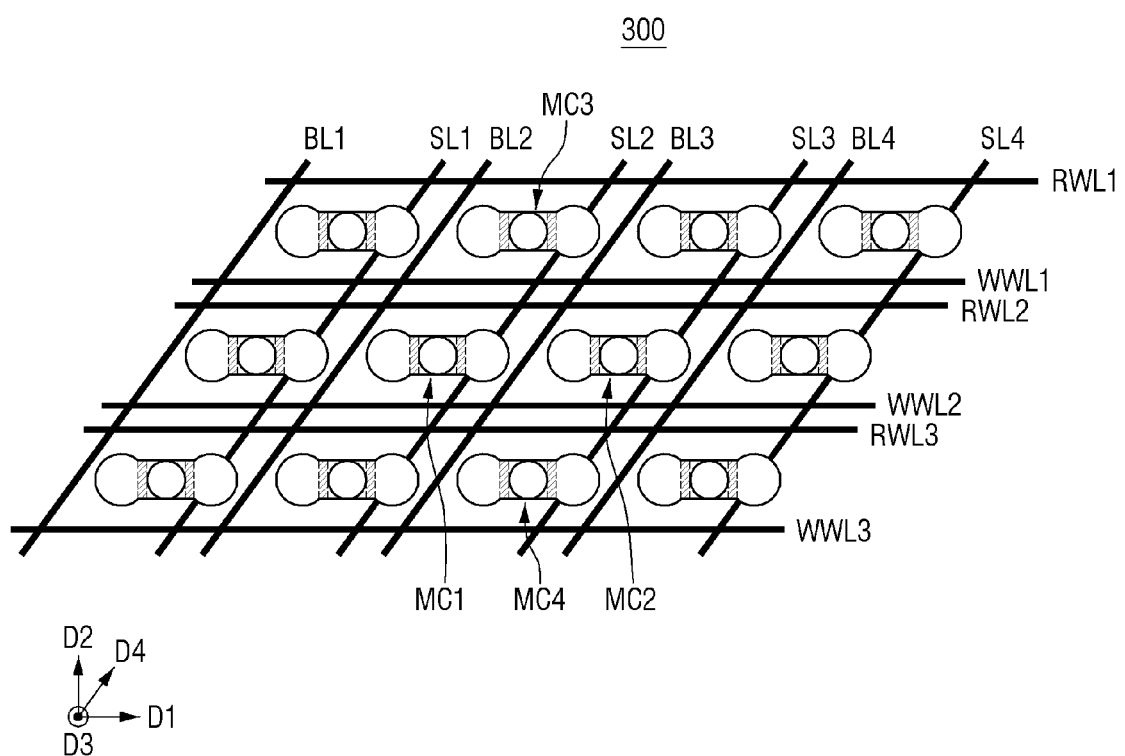
FIG. 4 is a plan view for explaining a memory cell array according to an embodiment of the inventive concept.

FIG. 4 is a plan view for explaining a memory cell array according to an embodiment of the inventive concept.

Referring to FIG. 4, the memory cell array 300 includes a plurality of bit lines BL1, BL2, BL3, and BL4, a plurality of sensing lines SL1, SL2, SL3, and SL4, a plurality of read word lines RWL1, RWL2, and RWL3, a plurality of write word lines WWL1, WWL2, and WWL3, and a plurality of memory cells MC1, MC2, MC3, and MC4.

The plurality of write word lines WWL1, WWL2, and WWL3 may extend in the first direction D1. The plurality of read word lines RWL1, RWL2, and RWL3 may extend in the first direction D1. The plurality of read word lines RWL1, RWL2, and RWL3 may be placed to be spaced apart from the plurality of write word lines WWL1, WWL2, and WWL3 in the second direction D2 intersecting the first direction D1. For example, a first read word line RWL1 may be placed to be spaced apart from a first write word line WWL1 in the first direction D2. For example, a second read word line RWL2 may be placed to be spaced apart from a second write word line WWL2 in the first direction D2. For example, a third read word line RWL3 may be placed to be spaced apart from a third write word line WWL3 in the first direction D2. In an embodiment, the plurality of write word lines WWL1, WWL2, and WWL3 and the plurality of read word lines RWL1, RWL2, and RWL3 are spaced apart from each other and are not in contact with each other.

The plurality of bit lines BL1, BL2, BL3, and BL4 and the plurality of sensing lines SL1, SL2, SL3, and SL4 may be placed to cross the plurality of write word lines WWL1, WWL2, and WWL3 and the plurality of read word lines RWL1, RWL2, and RWL3. In an embodiment, the plurality of bit lines BL1, BL2, BL3, and BL4 and the plurality of sensing lines SL1, SL2, SL3, and SL4 are not in direct contact with the plurality of write word lines WWL1, WWL2, and WWL3 and the plurality of read word lines RWL1, RWL2, and RWL3.

In an embodiment, the plurality of bit lines BL1, BL2, BL3, and BL4 and the plurality of sensing lines SL1, SL2, SL3, and SL4 extend in a fourth direction D4 that forms an acute angle with the first direction D1 and forms an acute angle with the second direction D2. That is, the fourth direction D4 may be a direction that exists between the first direction D1 and the second direction D2.

The plurality of bit lines BL1, BL2, BL3, and BL4 may extend in the fourth direction D4, while crossing the plurality of write word lines WWL1, WWL2, and WWL3 and the plurality of read word lines RWL1, RWL2, and RWL3. The plurality of sensing lines SL1, SL2, SL3, and SL4 may extend in the fourth direction D4, while crossing the plurality of write word lines WWL1, WWL2, and WWL3 and the plurality of read word lines RWL1, RWL2, and RWL3. Here, each of the sensing lines SL1, SL2, SL3, and SL4 may be spaced apart from each of the bit lines BL1, BL2, BL3, and BL4 in the first direction D1.

A plurality of memory cells MC1, MC2, MC3, and MC4 may be placed on the plurality of sensing lines SL1, SL2, SL3, and SL4. That is, the plurality of memory cells MC1, MC2, MC3, and MC4 may be placed to overlap the plurality of sensing lines SL1, SL2, SL3, and SL4. In this case, the plurality of memory cells MC1, MC2, MC3, and MC4 may be connected to the plurality of sensing lines SL1, SL2, SL3, and SL4. That is, the plurality of memory cells MC1, MC2, MC3, and MC4 may be arranged in the fourth direction D4 along the plurality of sensing lines SL1, SL2, SL3, and SL4. Further, the plurality of memory cells MC1, MC2, MC3, and MC4 in the same row may be arranged in the first direction D1. The arrangement of the plurality of memory cells MC1, MC2, MC3, and MC4 will be described in more detail below.

Figure 5:
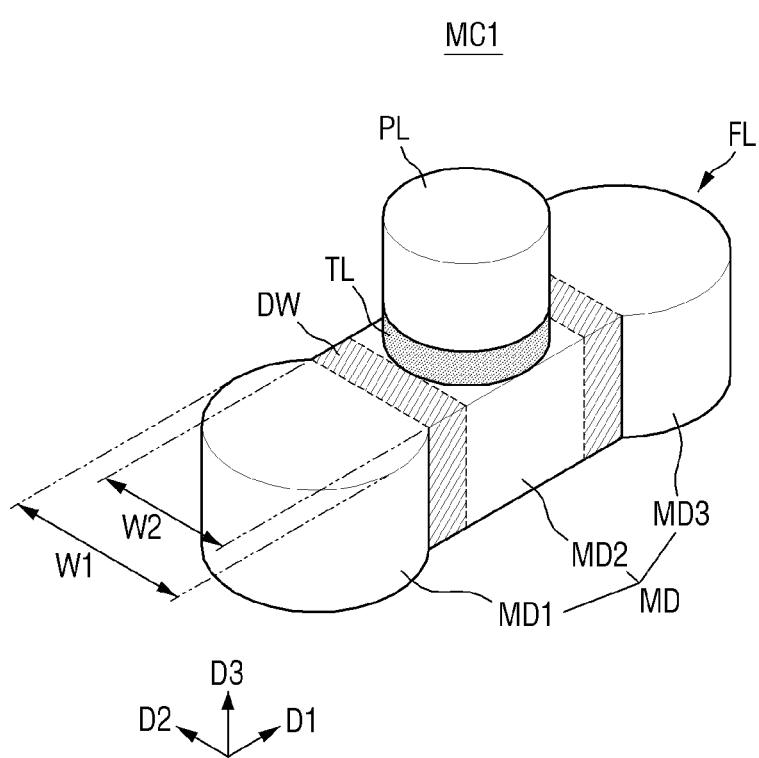
FIG. 5 is a perspective view for explaining a memory cell according to an embodiment of the inventive concept.

FIG. 5 is a perspective view for explaining a memory cell according to an embodiment of the disclosure.

Referring to FIG. 5, the memory cell MC1 includes a pinned layer PL, a magnetic layer FL, and a tunnel barrier pattern TL.

The magnetic layer FL may extend in the first direction D1 parallel to the upper surface of the magnetic layer FL. That is, the magnetic layer FL may have a long axis extending along the first direction D1. For example, the magnetic layer FL may have the shape of a track extending in the first direction D1. The magnetic layer FL may include at least one metallic material among cobalt (Co), iron (Fe), and nickel (Ni). Further, the magnetic layer FL may further include at least one among non-magnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

The magnetic layer FL may include a plurality of magnetic domains MD, and a plurality of magnetic domain walls DW. The plurality of magnetic domains MD and the plurality of magnetic domain walls DW may be arranged alternately along the first direction D1. The magnetic domain MD may be a region of uniform magnetization direction inside the magnetic layer FL, and the magnetic domain wall DW may be a region in which the magnetization direction changes between the plurality of magnetic domains MD inside the magnetic layer FL. The magnetic domain wall DW may define a boundary between the magnetic domains MD having different magnetization directions among the plurality of magnetic domains MD. The magnitude and magnetization direction of the magnetic domain MD may be adjusted appropriately by the shape, size, and external energy of the magnetic layer FL. The magnetic domain wall DW may move due to a magnetic field or current applied to the magnetic layer FL.

In an embodiment, the magnetic domain MD includes a first magnetic domain MD1, a second magnetic domain MD2, and a third magnetic domain MD3 arranged sequentially along the first direction D1. For example, the second magnetic domain MD2 may be located between the first magnetic domain MD1 and the third magnetic domain MD3. For example, the magnetic domain wall DW may be defined between the first magnetic domain MD1 and the second magnetic domain MD2, and the magnetic domain wall DW may be defined between the second magnetic domain MD2 and the third magnetic domain MD3.

In an embodiment, the pinned layer PL is located on the upper surface of the magnetic layer FL. For example, the pinned layer PL may perpendicularly overlap the second magnetic domain MD2. The pinned layer PL may include a ferromagnetic material. The pinned layer PL may further include an antiferromagnetic material for fixing the magnetization direction of the ferromagnetic material. For example, the pinned layer PL may include at least one metallic material among cobalt (Co), iron (Fe), and nickel (Ni). Further, the pinned layer PL may further include at least one among non-magnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

The tunnel barrier pattern TL may be interposed between the magnetic layer FL and the pinned layer PL. The tunnel barrier pattern TL may include at least one among a magnesium (Mg) oxide film, a titanium (Ti) oxide film, an aluminum (Al) oxide film, a magnesium-zinc (Mg—Zn) oxide film or a magnesium-boron (Mg—B) oxide film. In FIG. 5, although the pinned layer PL and the tunnel barrier pattern TL are shown as having a cylindrical shape, this is an example, and embodiments of the present disclosure are not limited thereto.

In an embodiments, the width of the magnetic layer FL corresponding to the first magnetic domain MD1 and the third magnetic domain MD3 is greater than the width of the magnetic layer FL corresponding to the second magnetic domain MD2. For example, a first width W1 of the magnetic layer FL corresponding to the first magnetic domain MD1 and the third magnetic domain MD3 in the second direction D2 may be greater than a second width W2 of the magnetic layer FL corresponding to the second magnetic domain MD2 in the second direction D2. That is, the magnetic layer FL corresponding to the second magnetic domain MD2 may have a rectangular parallelepiped shape, the magnetic layer FL corresponding to the first magnetic domain MD1 and the third magnetic domain MD3 may have a cylindrical shape, and the width of the cylindrical shape may be greater than the width of the rectangular parallelepiped shape.

In the present embodiment, although the magnetic layer FL corresponding to the first magnetic domain MD1 and the third magnetic domain MD3 is shown as a cylindrical shape, the embodiment of the present disclosure is not limited thereto. That is, even if the first width W1 of the magnetic layer FL corresponding to the first magnetic domain MD1 and the third magnetic domain MD3 is greater than the second width W2 of the magnetic layer FL corresponding to the second magnetic domain MD2, embodiments of the present disclosure are not limited to the shape. Because the first width W1 of the magnetic layer FL corresponding to the first magnetic domain MD1 and the third magnetic domain MD3 is greater than the second width W2 of the magnetic layer FL corresponding to the second magnetic domain MD2, the magnetic domain wall DW may not move to the magnetic domain FL corresponding to the first magnetic domain MD1 and the third magnetic domain MD3.

Figure 6:
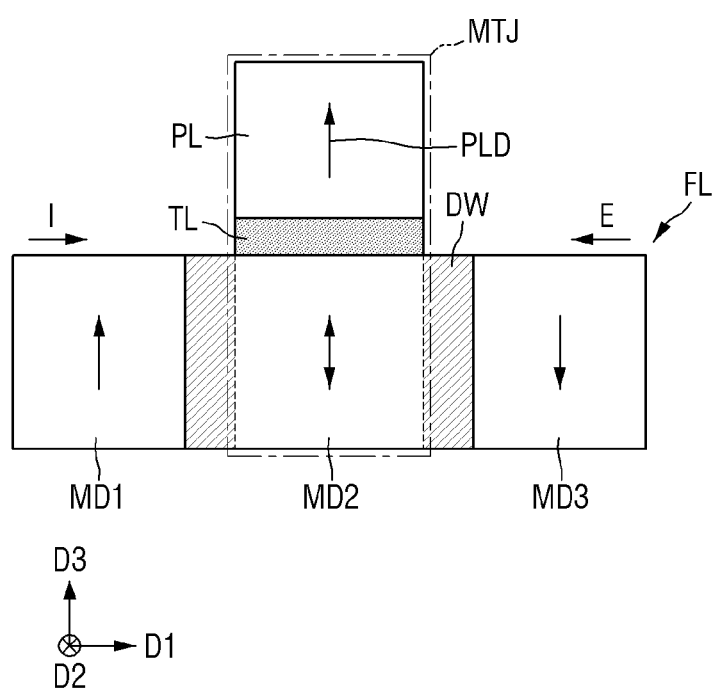
FIGS. 6 to 8 are front views for explaining a memory cell according to an embodiment of the inventive concept.
Figure 7:
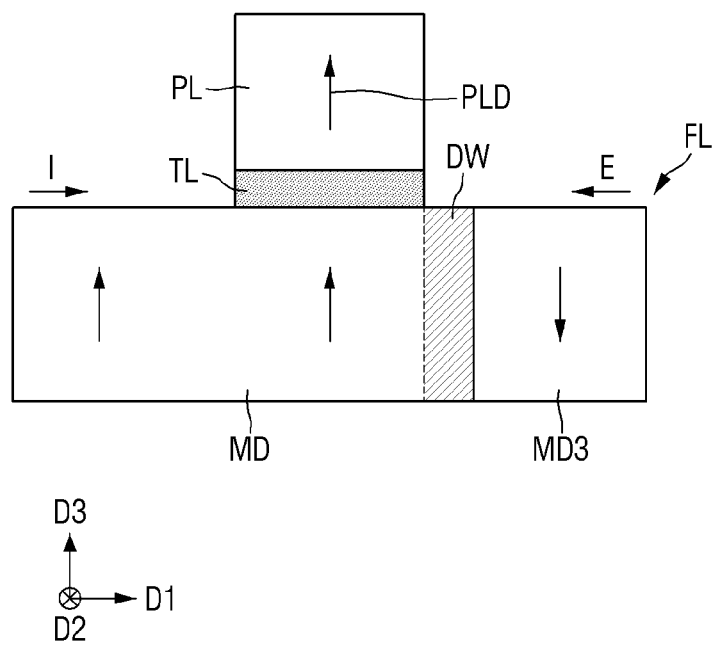
Figure 8:
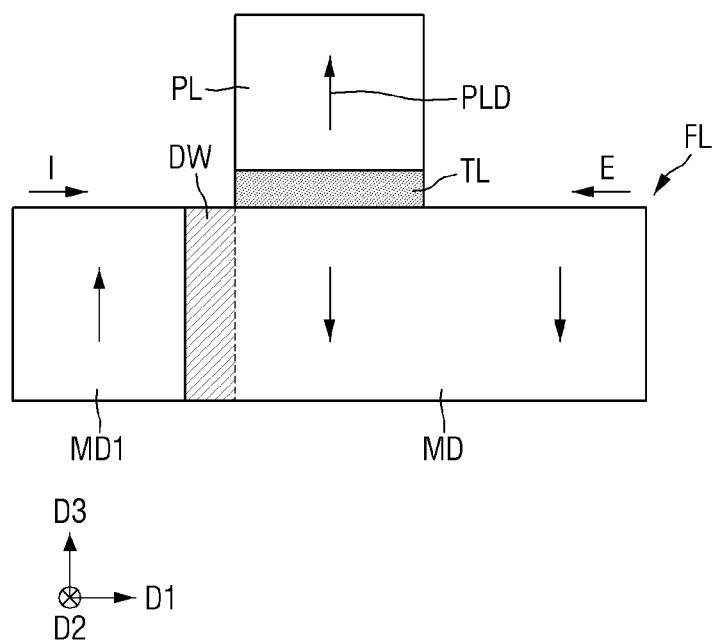

FIGS. 6 to 8 are front views for explaining a memory cell according to an embodiment of the disclosure.

Referring to FIG. 6, the pinned layer PL may be a reference layer having a magnetization direction fixed in one direction. The magnetic layer FL may be reference layer having a changeable magnetization direction. The second magnetic domain MD2 may have a magnetization direction that may be changed to be parallel or anti-parallel depending on the magnetization direction PLD of the pinned layer PL.

In an embodiment, the magnetization direction PLD of the pinned layer PL and the magnetization direction of the first to third magnetic domains MD1, MD2, and MD3 are perpendicular to an interface between the pinned layer PL and the tunnel barrier pattern TL. That is, the magnetization direction PLD of the pinned layer PL and the magnetization direction of the first to third magnetic domains MD1, MD2, and MD3 may be the third direction D3. In this case, the pinned layer PL and the first to third magnetic domains MD1, MD2, and MD3 may have vertical magnetic anisotropy (PMA). As used herein, the magnetic anisotropy may mean a property that exhibits a preference in a particular direction when spins are aligned by a magnetic field in a ferromagnetic material. The vertical magnetic anisotropy (PMA) may mean a property that prefers a magnetization direction perpendicular to the widest surface of the ferromagnetic material.

The pinned layer PL and the magnetic layer FL may include a ferromagnetic metal having the vertical magnetic anisotropy. The pinned layer PL and the magnetic layer FL may include at least one of a vertical magnetic material (for example, CoFeTb, CoFeGd, and CoFeDy), a vertical magnetic material having an L10 structure, CoPt having a hexagonal close packed lattice structure, and the vertical magnetic structure. The vertical magnetic material having the L10 structure may include at least one of FePt of an L10 structure, FePd of an L10 structure, CoPd of an L10 structure, or CoPt of an L10 structure. As an example, CoPt of the hexagonal close packed lattice (HCP) structure may include a cobalt-platinum (Co—Pt) disordered alloy or Co3Pt ordered alloy having a platinum (Pt) content of approximately 10% to 45%. The vertical magnetic structure may include magnetic layers and non-magnetic layers that are stacked alternately and repeatedly. As an example, the vertical magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n (n is the number of stacks) and the like.

In an embodiments, a current I for movement of the magnetic domain wall DW flows through the magnetic layer FL. A direction of movement of the magnetic domain wall DW may be determined along the direction of the current I. The magnetic domain wall DW may move along a direction of movement of an electron E. That is, the magnetic domain wall DW may move in a direction opposite to the direction of the current I. Hereinafter, among the magnetic domains that move by the movement of the magnetic domain wall DW, the magnetic domain arranged on the lower surface of the pinned layer PL is defined as a second magnetic domain MD2. The magnetic tunnel junction MTJ may include the second magnetic domain MD2 and the pinned layer PL.

Referring to FIG. 7, the magnetic domain wall DW may move in the first direction D1 by the current I flowing in the first direction D1. The magnetic domain wall DW may be defined between the magnetic domain MD and the third magnetic domain MD3. That is, the magnetic domain MD and the third magnetic domain MD3 whose magnetization directions are opposite to each other may be defined by movement of the magnetic domain wall DW. That is, the magnetization direction of the magnetic domain arranged on the lower surface of the pinned layer PL may be parallel to the magnetization direction PLD of the pinned layer PL, by movement of the magnetic domain wall DW. Here, although not shown, the magnetization direction inside the magnetic domain wall DW may rotate stepwise. For example, the magnetization direction of the magnetic domain arranged on the lower surface of the pinned layer PL may be the same as the magnetization direction PLD of the pinned layer PL.

Referring to FIG. 8, the magnetic domain wall DW may move in the direction opposite to the first direction D1 by the current I flowing in the first direction D1. The magnetic domain wall DW may be defined between the magnetic domain MD and the first magnetic domain MD1. That is, the magnetic domain MD and the first magnetic domain MD1 whose magnetization directions are opposite to each other may be formed by movement of the magnetic domain wall DW. That is, the magnetization direction of the magnetic domain arranged on the lower surface of the pinned layer PL may be anti-parallel to the magnetization direction PLD of the pinned layer PL by movement of the magnetic domain wall DW. For example, the magnetization direction of the magnetic domain arranged on the lower surface of the pinned layer PL may be opposite to the magnetization direction PLD of the pinned layer PL.

For example, the magnetic domain wall DW may move at a speed of 50 m/s, and the drive speed of the write operation may be as fast as a few nanoseconds (ns), for example, 1 ns. That is, the magnetic domain wall DW may move very quickly, and the magnetization direction of the second magnetic domain MD2 may be switched very quickly. Hereinafter, the magnetic domains are divided into the first, second and third magnetic domains MD1, MD2, and MD3, and magnetic domain walls DW interposed between the first magnetic domain MD1 and the second magnetic domain MD2, and between the second magnetic domain MD2 and the third magnetic domain MD3 will be explained separately.

Referring to FIG. 6 again, the read current may flow through the magnetic tunnel junction MTJ at the time of the read operation. The resistance state of the magnetic tunnel junction MTJ may be detected by the read current. For example, the read current may be used to detect whether the magnetic tunnel junction MTJ is in a high resistance state or in a low resistance state. For example, when the magnetization direction of the second magnetic domain MD2 is parallel to the magnetization direction PLD of the pinned layer PL, the magnetic tunnel junction MTJ may be in the low resistance state. Further, for example, when the magnetization direction of the second magnetic domain MD2 is anti-parallel to the magnetization direction PLD of the pinned layer PL, the magnetic tunnel junction MTJ may be in the high resistance state. Data (0 or 1) stored in the second magnetic domain MD2 may be detected from the resistance state of the magnetic tunnel junction MTJ. For example, the magnetic tunnel junction MTJ in the high resistance state could represent Data 1 and the magnetic tunnel junction MTJ in the low resistance state could represent Data 0, or vice versa.

The write current may flow through the magnetic tunnel junction MTJ at the time of the write operation. The magnitude of the write current may be greater than the magnitude of the read current. The magnetization direction of the second magnetic domain MD2 may be reversed by a spin transfer torque generated by the write current. That is, the magnetization direction of the second magnetic domain MD2 may be switched to be parallel or anti-parallel to the magnetization direction PLD of the pinned layer PL by the write current.

Figure 9:
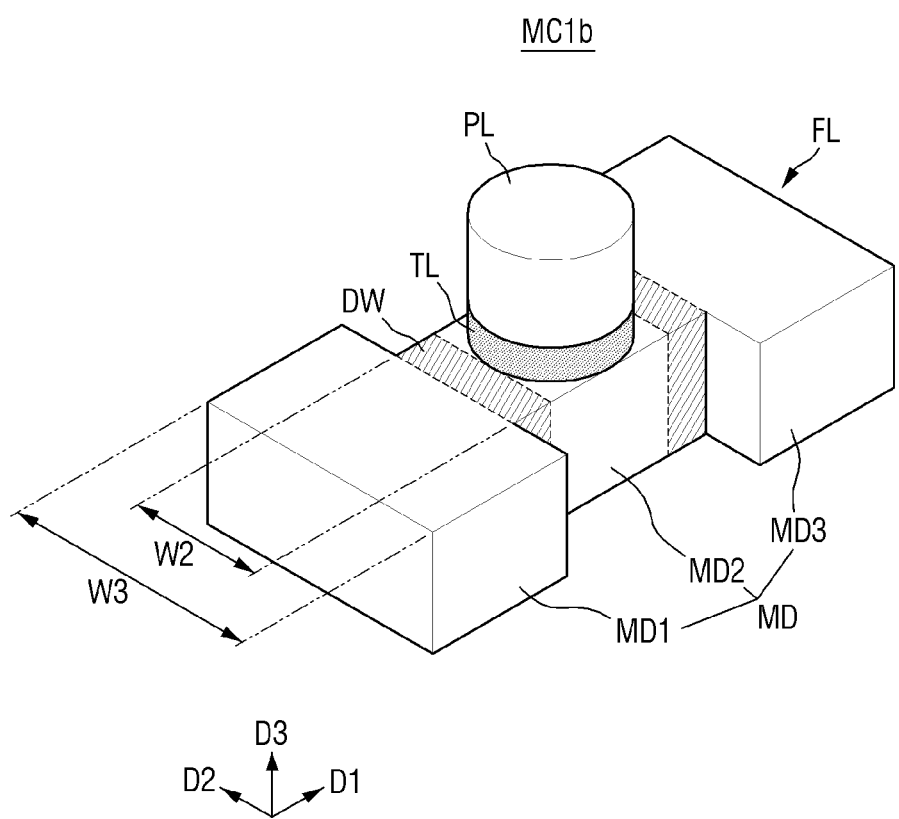
FIG. 9 is a perspective view for explaining the memory cell according to an embodiment of the inventive concept.

FIG. 9 is a perspective view for explaining the memory cell according to an embodiment of the disclosure.

Referring to FIG. 9, a memory cell MC1b includes a magnetic layer FL including the first magnetic domain MD1, the second magnetic domain MD2, and the third magnetic domain MD3. In an embodiment, a third width W3 of the magnetic layer FL corresponding to the first magnetic domain MD1 and the third magnetic domain MD3 is greater than the second width W2 corresponding to the second magnetic domain MD2. In this case, the magnetic layer FL corresponding to the first magnetic domain MD1 and the third magnetic domain MD3 may have a rectangular parallelepiped shape. However, embodiments of the present disclosure are not limited thereto. For example, the magnetic layer FL corresponding to the first magnetic domain MD1, the magnetic layer FL corresponding to the second magnetic domain MD2, and the magnetic layer FL corresponding to the third magnetic domain MD3 may all have different shapes.

Figure 10:
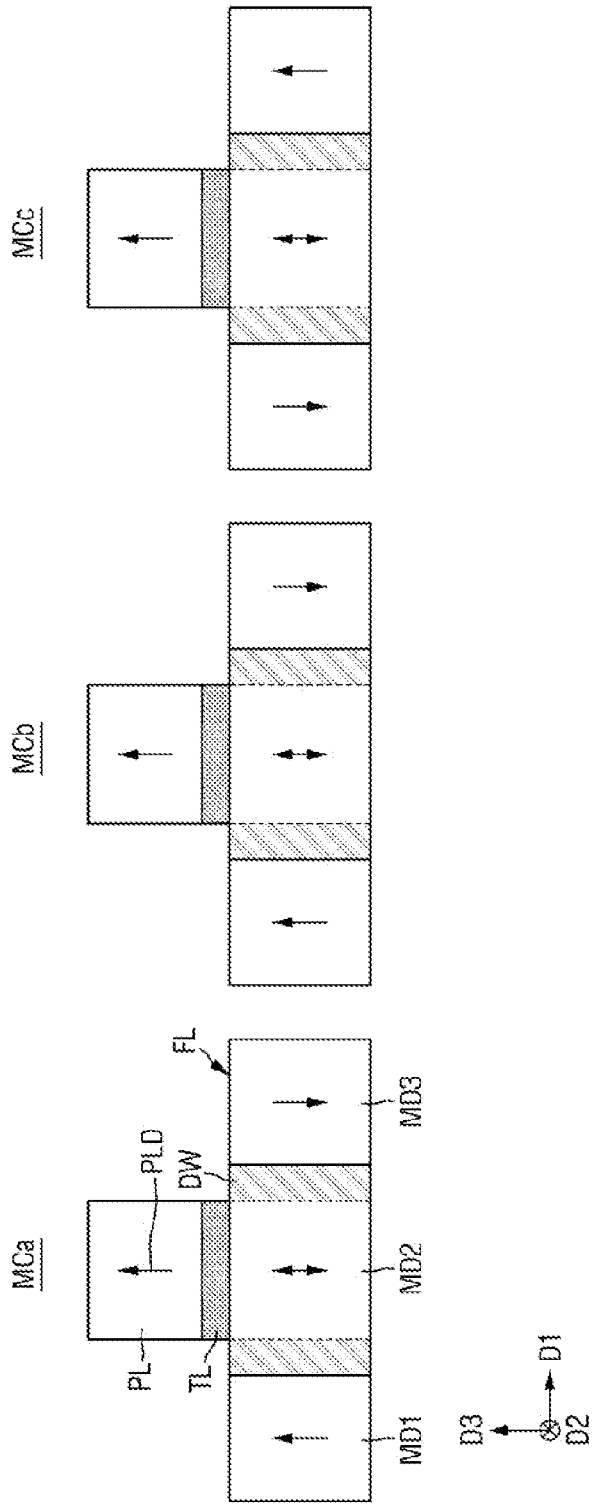
FIGS. 10 and 11 are front views for explaining a method of initializing a memory device according to an embodiment of the inventive concept.
Figure 11:
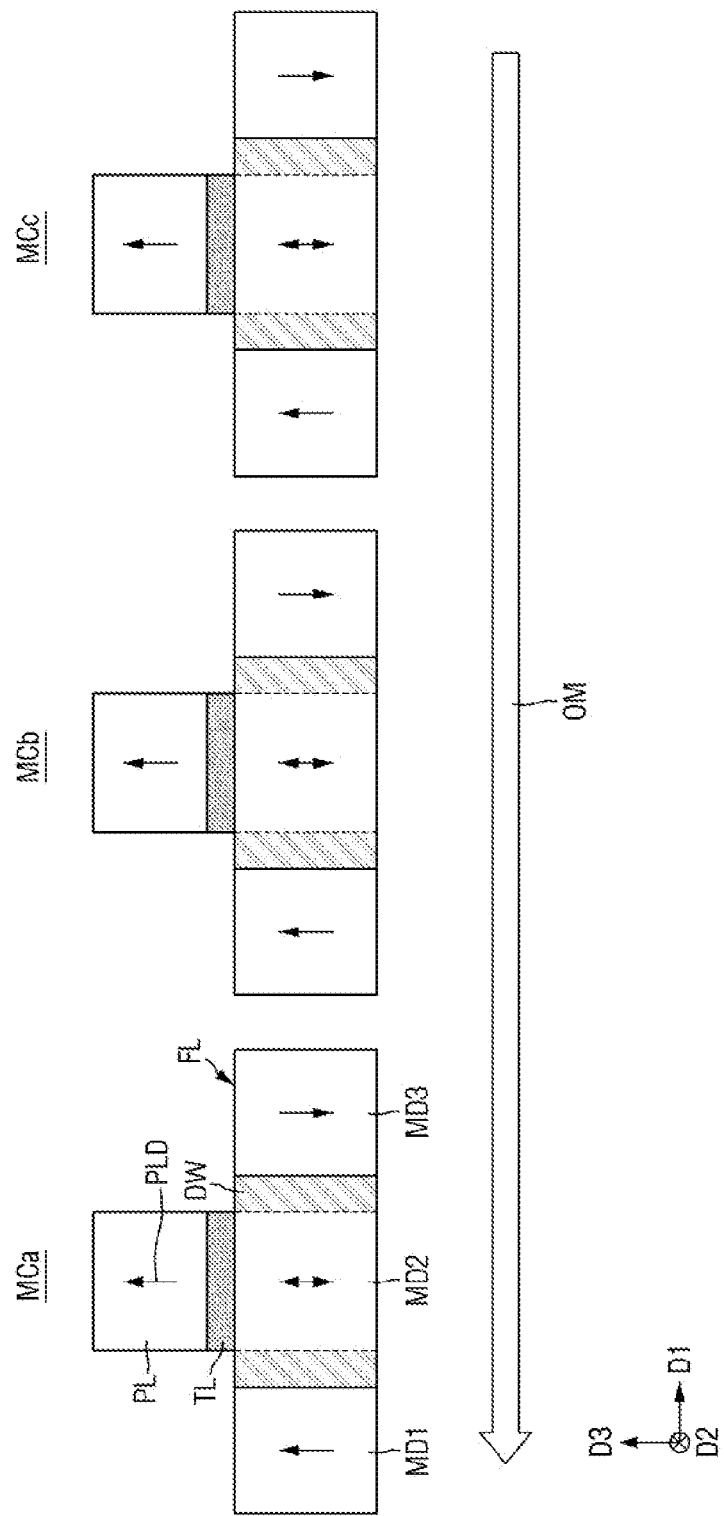

FIGS. 10 and 11 are front views for explaining a method of initializing a memory device according to an embodiment of the disclosure.

Referring to FIG. 10, memory cells MCa, MCb, and MCc of the nonvolatile memory 200 are in an uninitialized state. The magnetization directions of the first magnetic domain MD1 and the third magnetic domain MD3 of the memory cells MCa, MCb, and MCc may be randomly formed. The magnetization directions of the first magnetic domain MD1 and the third magnetic domain MD3 of the memory cells MCa, MCb, and MCc may be parallel or anti-parallel to the magnetization direction PDL of the pinned layer PL. In this case, although the magnetization direction of the first magnetic domain MD1 of the memory cell MCa and the magnetization direction of the first magnetic domain MD1 of the memory cell MCb may be parallel, the magnetization direction of the first magnetic domain MD1 of the memory cell MCc may be anti-parallel to the magnetization direction of the first magnetic domain MD1 of the memory cell MCa and the magnetization direction of the first magnetic domain MD1 of the memory cell MCb. That is, the magnetization directions of all the memory cells MCa, MCb, and MCc may not be aligned.

Referring to FIG. 11, an external magnetic field processing step is performed on the nonvolatile memory 200. The external magnetic field processing step may apply an external magnetic field OM to the memory cells MCa, MCb, and MCc. As the external magnetic field OM is applied to the memory cells MCa, MCb, and MCc, the magnetization directions of the memory cells MCa, MCb, and MCc may be aligned. That is, the magnetization direction of the memory cell MCc may become the same as the magnetization direction of other memory cells MCa and MCb by the external magnetic field OM. For example, the magnetization direction of the first magnetic domain MD1 of the memory cell MCc after the external magnetic field OM is applied may be parallel to the magnetization directions of the first magnetic domain MD1 of the memory cell MCa and the first magnetic domain MD1 of the memory cell MCb. That is, the magnetization directions of the memory cells MCa, MCb, and MCc may be aligned according to the external magnetic field processing step. When no external magnetic field OM is applied, the magnetization directions of the memory cells MCa, MCb, and MCc may be fixed.

Figure 12:
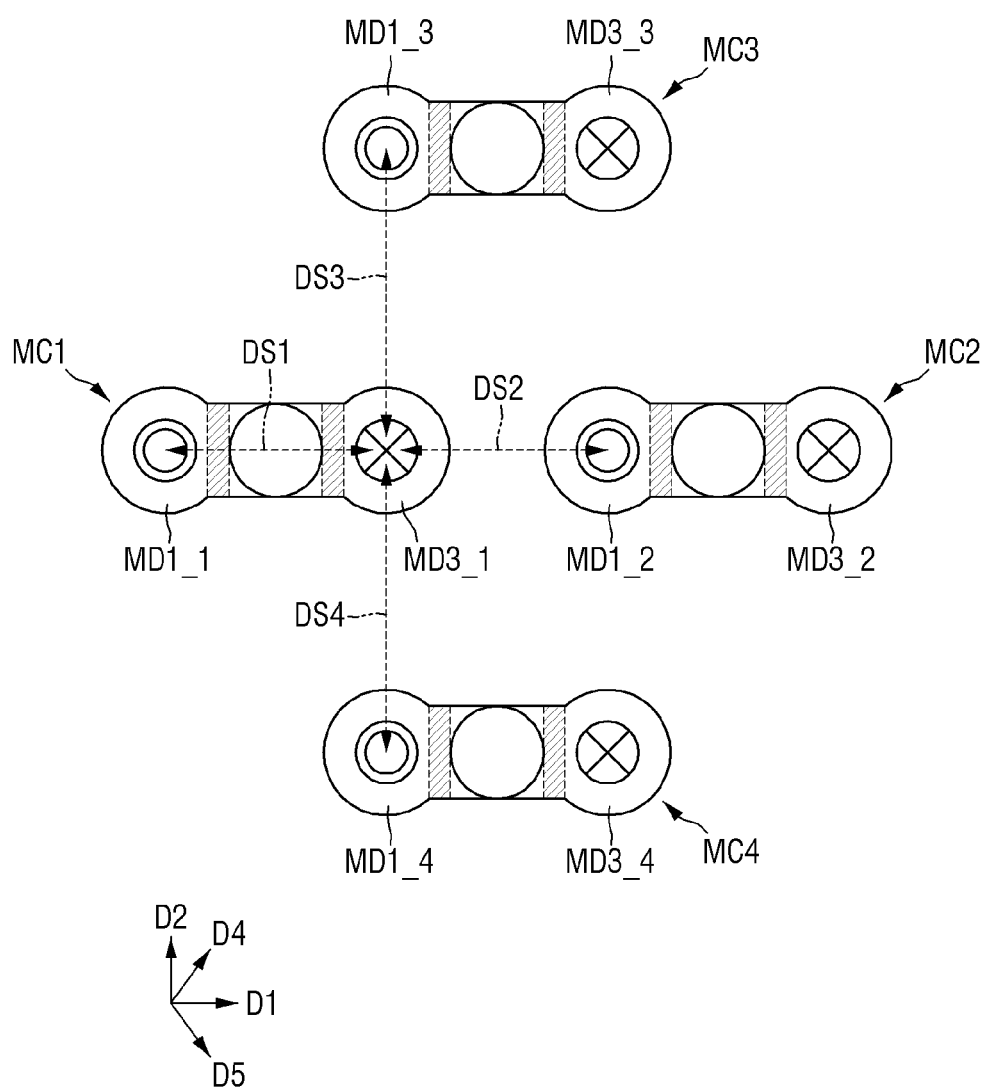
FIG. 12 is a plan view for explaining the arrangement of the memory cells according to an embodiment of the inventive concept.

FIG. 12 is a plan view for explaining the arrangement of the memory cells according to an embodiment of the disclosure.

Referring to FIG. 12, a memory cell array 300 may include a plurality of memory cells MC1, MC2, MC3, and MC4. The plurality of memory cells MC1, MC2, MC3, and MC4 may be arranged on a plane. The plurality of memory cells MC1, MC2, MC3, and MC4 may be spaced apart from each other. Although not shown in the drawings, each of the memory cells MC1, MC2, MC3, and MC4 may be connected to a plurality of bit lines BL1, BL2, BL3, and BL4, a plurality of sensing lines SL1, SL2, SL3, and SL4, a plurality of read word lines RWL1, RWL2, and RWL3, a plurality of write word lines WWL1, WWL2, and WWL3, and the like shown in FIG. 4. FIG. 12 will be described using only the plurality of memory cells MC1, MC2, MC3, and MC4.

The first memory cell MC1 includes a first magnetic domain MD1_1 and a third magnetic domain MD3_1 arranged in the first direction D1. The first memory cell MC1 includes a magnetic domain wall DW defined between the first magnetic domain MD1_1 and the third magnetic domain MD3_1. The second memory cell MC2 includes a first magnetic domain MD1_2 and a third magnetic domain MD3_2 arranged in the first direction D1. The second memory cell MC2 includes a magnetic domain wall DW defined between the first magnetic domain MD1_2 and the third magnetic domain MD3_2. The third memory cell MC3 includes a first magnetic domain MD1_3 and a third magnetic domain MD3_3 arranged in the first direction D1. The third memory cell MC3 includes a magnetic domain wall DW defined between the first magnetic domain MD1_3 and the third magnetic domain MD3_3. The fourth memory cell MC4 includes a first magnetic domain MD1_4 and a third magnetic domain MD3_4 arranged in the first direction D1. The fourth memory cell MC4 includes a magnetic domain wall DW defined between the first magnetic domain MD1_4 and the third magnetic domain MD3_4. In an embodiment, the magnetization direction of the third magnetic domain MD3_1 of the first magnetic memory cell MC1 is anti-parallel to the first magnetic domain of three of the magnetic memory cells that are adjacent and surround the first magnetic memory cell MC1. For example, first magnetic domains MD1_2, MD1_3, and MD1_4 of three memory cells MC2, MC3, and MC4 adjacent and surrounding the first magnetic memory cell MC1 may have magnetization directions anti-parallel to the magnetization direction of the third magnetic domain MD3_1 of the first memory cell MC1.

In an embodiment, the magnetization direction of the first magnetic domain MD1_1, the magnetization direction of the first magnetic domain MD1_2, the magnetization direction of the first magnetic domain MD1_3, and the magnetization direction of the first magnetic domain MD1_4 are parallel to each other. For example, the magnetization direction of the first magnetic domain MD1_1, the magnetization direction of the first magnetic domain MD1_2, the magnetization direction of the first magnetic domain MD1_3, and the magnetization direction of the first magnetic domain MD1_4 may all be the third direction D3.

In an embodiment, the magnetization direction of the third magnetic domain MD3_1, the magnetization direction of the third magnetic domain MD3_2, the magnetization direction of the third magnetic domain MD3_3, and the magnetization direction of the third magnetic domain MD3_4 are parallel to each other. For example, the magnetization direction of the third magnetic domain MD3_1, the magnetization direction of the third magnetic domain MD3_2, the magnetization direction of the third magnetic domain MD3_3, and the magnetization direction of the third magnetic domain MD3_4 may all be directions opposite to the third direction D3.

The second memory cell MC2 may be spaced apart from the first memory cell MC1 in the first direction D1. Since both the first memory cell MC1 and the second memory cell MC2 are formed to extend in the first direction D1, both the first memory cell MC1 and the second memory cell MC2 may be placed on a straight line in the first direction D1.

The third memory cell MC3 may be spaced apart from the first memory cell MC1 and the second memory cell MC2 in the second direction D2. Further, the fourth memory cell MC4 may be spaced apart from the first memory cell MC1 and the second memory cell MC2 in the direction opposite to the second direction D2. The first magnetic domain MD1_3 of the third memory cell MC3 may be spaced apart from the third magnetic domain MD3_1 of the first memory cell MC1 in the second direction D2, and the first magnetic domain MD1_4 of the fourth memory cell MC4 may be spaced apart from the third magnetic domain MD3_1 of the first memory cell MC1 in the direction opposite to the second direction D2. That is, the first magnetic domain MD1_3 of the third memory cell MC3, the third magnetic domain MD3_1 of the first memory cell MC1, and the first magnetic domain MD1_4 of the fourth memory cell MC4 may be placed on a straight line in the second direction D2. That is, the third magnetic domain MD3_1 of the first memory cell MC1 may be surrounded by the first magnetic domain MD1_1 of the first memory cell MC1, the first magnetic domain MD1_3 of the third memory cell MC3, the first magnetic domain MD1_4 of the fourth memory cell MC4, and the first magnetic domain MD1_2 of the second memory cell MC2. In an embodiment, the magnetization directions of the third magnetic domain MD3_1 of the first memory cell MC1 is anti-parallel to the magnetization directions of the first magnetic domain MD1_1 of the first memory cell MC1, the first magnetic domain MD1_3 of the third memory cell MC3, the first magnetic domain MD1_4 of the fourth memory cell MC4, and the first magnetic domain MD1_2 of the second memory cell MC2. However, the embodiments of the present disclosure are not limited thereto.

Since the third magnetic domain MD3_1 of the first memory cell MC1 is surrounded by the first magnetic domain MD1_1 of the first memory cell MC1, the first magnetic domain MD1_3 of the third memory cell MC3, the first magnetic domain MD1_4 of the fourth memory cell MC4, and the first magnetic domain MD1_2 of the second memory cell MC2, a bipolar interaction between the magnetic domains may occur. Accordingly, the magnetization directions of each magnetic domain included in the memory cells MC1, MC2, MC3, and MC4 may be anti-parallel to each other. Therefore, the reliability of the nonvolatile memory 200 including the initialized memory cells MC1, MC2, MC3, and MC4 may be further improved.

In an embodiment, a first distance DS1 between the first magnetic domain MD1_1 and the third magnetic domain MD3_1 of the first memory cell MC1, a second distance DS2 between the third magnetic domain MD3_1 and the first magnetic domain MD1_2, a third distance DS3 between the third magnetic domain MD3_1 and the first magnetic domain MD1_3, and a fourth distance DS4 between the third magnetic domain MD3_1 and the first magnetic domain MD1_4 are all the same or substantially the same. That is, the third magnetic domain MD3_1 of the first memory cell MC1 may be spaced by the same distance from the magnetic domains that are anti-parallel to the third magnetic domain MD3_1 and surround the third magnetic domain MD3_1. Therefore, the reliability of the nonvolatile memory 200 including the memory cells MC1, MC2, MC3, and MC4 may be further improved.

Figure 13:
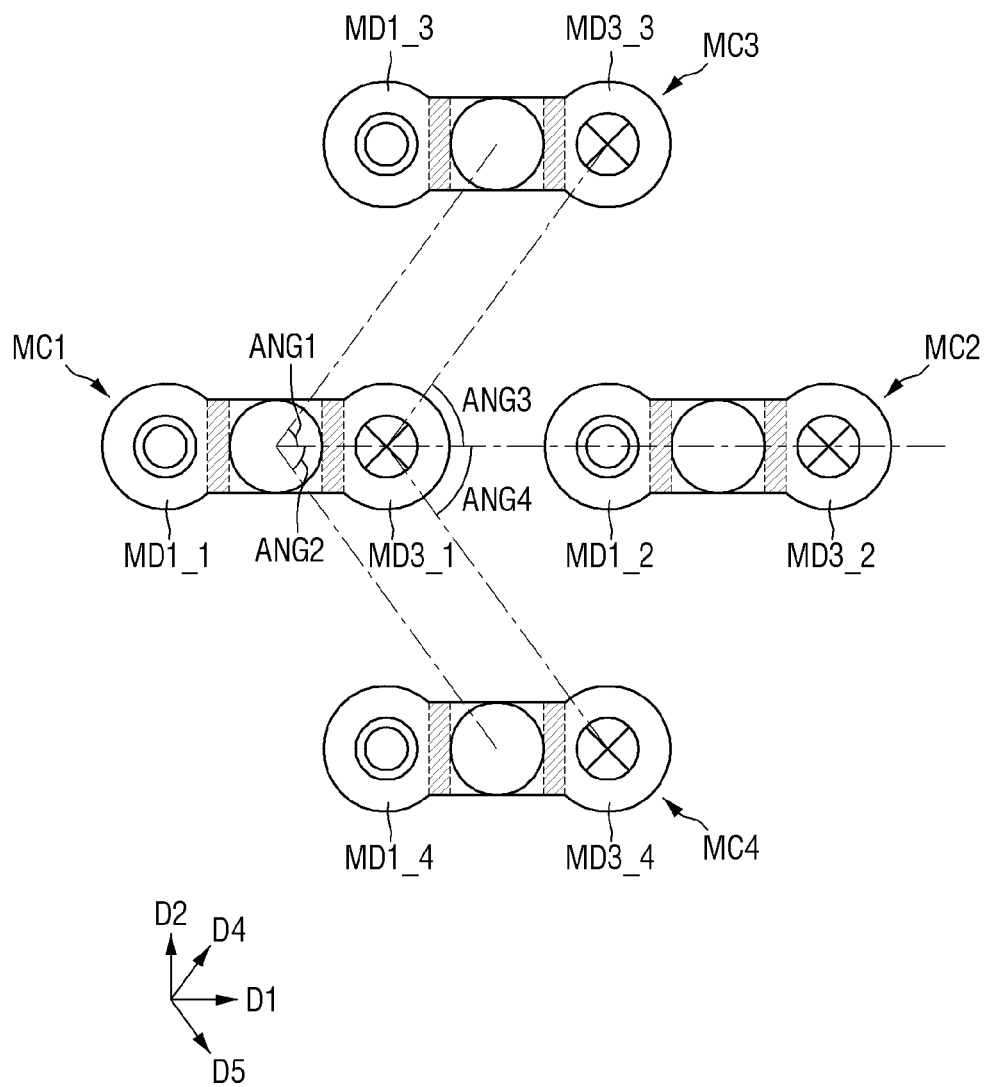
FIG. 13 is a plan view for explaining the arrangement of memory cells according to an embodiment of the inventive concept.

FIG. 13 is a plan view for explaining the arrangement of memory cells according to an embodiment of the disclosure.

Referring to FIGS. 12 and 13, the first memory cell MC1 and the second memory cell MC2 may be placed on a straight line in the first direction D1. That is, the first memory cell MC1 and the second memory cell MC2 may be placed on the horizontal line in the first direction D1. Further, both the first memory cell MC1 and the second memory cell MC2 may extend in the first direction D1.

In an embodiment, the third memory cell MC3 is spaced apart from the first memory cell MC1 in the fourth direction D4. In an embodiment, the fourth direction D4 forms an acute angle with the first direction D1, and also forms an acute angle with the second direction D2. For example, the first direction D1 and the fourth direction D4 may form a first angle ANG1. Although the first angle ANG1 is illustrated in FIG. 13 as being about, around, or exactly 45 degrees, embodiments of the present disclosure are not limited thereto. For example, the first angle ANG1 may be an acute angle that differs from 45 degrees. For example, the first angle ANG1 may slightly differ from 45 degrees to be 43 degrees, 47 degrees, etc.

The fourth memory cell MC4 may be spaced apart from the first memory cell MC1 in a fifth direction D5. In an embodiment, the fifth direction D5 forms an acute angle with the first direction D1, and also forms an acute angle with the direction opposite to the second direction D2. For example, the first direction D1 and the fifth direction D5 may form a second angle ANG2. Although the second angle ANG2 is illustrated in FIG. 13 as being about, around, or exactly 45 degrees, embodiments of the present disclosure are not limited thereto. For example, the second angle ANG2 may be an acute angle that differs from 45 degrees. For example, the second angle ANG2 may slightly differ from 45 degrees to be 43 degrees, 47 degrees, etc.

The third magnetic domain MD3_1 of the first memory cell MC1 may be spaced apart from the third magnetic domain MD3_3 of the third memory cell MC3. The third magnetic domain MD3_3 of the third memory cell MC3 may be spaced apart from the third magnetic domain MD3_1 of the first memory cell MC1 in the fourth direction D4. In an embodiment, the fourth direction D4 and the first direction D1 form a third angle ANG3, which is an acute angle. Although the third angle ANG3 is illustrated in FIG. 13 as being about, around, or exactly 45 degrees, embodiments of the present disclosure are not limited thereto. For example, the third angle ANG3 may be an acute angle different from 45 degrees. For example, the third angle ANG3 may slightly differ from 45 degrees to be 43 degrees, 47 degrees, etc. Although the third angle ANG3 may be the same as the first angle ANG1, embodiments of the present disclosure are not limited thereto. In an embodiment, the first memory cell MC1 and the third memory cell MC3 are arranged diagonally with respect to one another.

The third magnetic domain MD3_1 of the first memory cell MC1 may be spaced apart from the third magnetic domain MD3_4 of the fourth memory cell MC4. The third magnetic domain MD3_4 of the fourth memory cell MC4 may be spaced apart from the third magnetic domain MD3_1 of the first memory cell MC1 in the fifth direction D5. In an embodiment, the fifth direction D5 and the first direction D1 form a fourth angle ANG4, which is an acute angle. Although the fourth angle ANG4 is illustrated in FIG. 13 as being about, around, or exactly 45 degrees, embodiments of the present disclosure are not limited thereto. For example, the fourth angle ANG4 may be an acute angle different from 45 degrees. For example, the fourth angle ANG4 may slightly differ from 45 degrees to be 43 degrees, 47 degrees, etc. Although the fourth angle ANG4 may be the same as the second angle ANG2, embodiments of the present disclosure are not limited thereto. In an embodiment, the third memory cell MC3 and the fourth memory cell MC4 are arranged diagonally with respect to one another.

In an embodiment, the magnetization direction of the third magnetic domain MD3_1 of the first memory cell MC1 and the magnetization direction of the third magnetic domain MD3_3 of the third memory cell MC3 are parallel to each other or arranged in a same direction. In an embodiment, the magnetization direction of the third magnetic domain MD3_1 of the first memory cell MC1 and the magnetization direction of the third magnetic domain MD3_4 of the fourth memory cell MC4 are parallel to each other or arranged in a same direction. As a plurality of memory cells MC1, MC2, MC3, and MC4 are arranged as in FIGS. 12 and 13, a bipolar interaction between the magnetic domains of the plurality of memory cells MC1, MC2, MC3, and MC4 may occur. Accordingly, the magnetization directions of each of the magnetic domains included in the memory cells MC1, MC2, MC3, and MC4 may be anti-parallel to each other. Therefore, the reliability of the nonvolatile memory 200 including the initialized memory cells MC1, MC2, MC3, and MC4 may be further improved.

Figure 14:
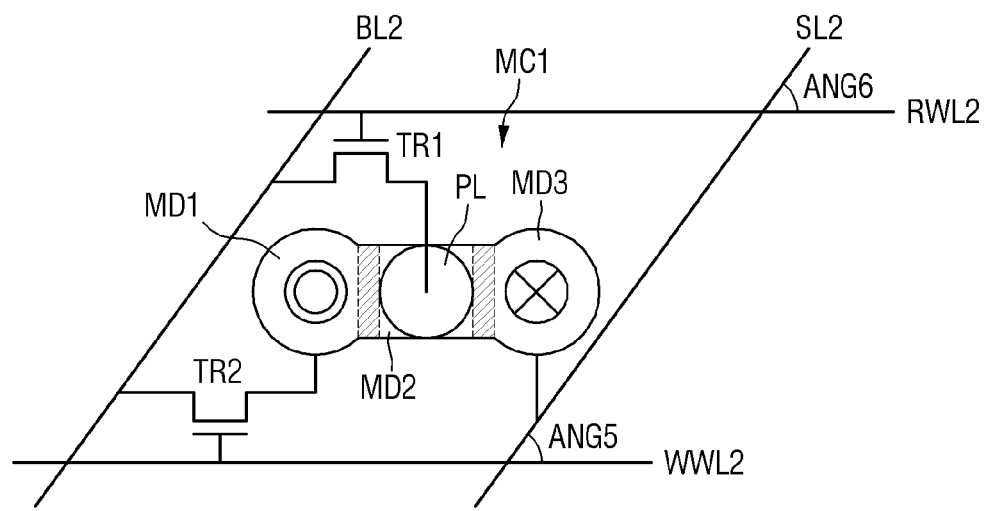
FIG. 14 is a plan view for explaining a memory cell array according to an embodiment of the inventive concept.

FIG. 14 is a plan view for explaining a memory cell array according to an embodiment of the disclosure.

Referring to FIG. 14, the first memory cell MC1 may be connected to the second read word line RWL2, the second write word line WWL2, the second bit line BL2, and the second sensing line SL2. Further, while the first memory cell MC1 is shown in FIG. 14 as being located in a region surrounded by the second read word line RWL2, the second write word line WWL2, the second bit line BL2, and the second sensing line SL2, embodiments of the present disclosure are not limited thereto.

The pinned layer PL of the first memory cell MC1 may be connected to the second read word line RWL2 and the second bit line BL2 through the first transistor TR1. For example, a gate of the first transistor TR1 may be connected to the second read word line RWL2. One of source drains of the first transistor TR1 may be connected to the second bit line BL2, and the other of the source drains of the first transistor TR1 may be connected to the pinned layer PL.

The magnetic layer FL corresponding to the first magnetic domain MD1 of the first memory cell MC1 may be connected to the second write word line WWL2 and the second bit line BL2 through the second transistor TR2. For example, the gate of the second transistor TR2 may be connected to the second write word line WWL2. For example, one of the source drains of the second transistor TR2 may be connected to the second bit line BL2, and the other of the source drains of the second transistor TR2 may be connected to the magnetic layer FL corresponding to the first magnetic domain MD1.

The magnetic layer FL corresponding to the third magnetic domain MD3 of the first memory cell MC1 may be connected to the second sensing line SL2.

An angle between the second write word line WWL2 and the second sensing line SL2 may be referred to as a fifth angle ANG5. An angle between the second read word line RWL2 and the second sensing line SL2 may be referred to as a sixth angle ANG6. Here, the fifth angle ANG5 and the sixth angle ANG6 may be acute angles. Although the fifth angle ANG5 and the sixth angle ANG6 are illustrated in FIG. 14 as being about 45 degrees, embodiments of the present disclosure are not limited thereto.

The first memory cell MC1, the second write word line WWL2, the second read word line RWL2, the second bit line BL2, and the second sensing line SL2 may correspond to a spin-orbit-torque (SOT) MRAM. Data stored in the first memory cell MC1 may be changed by the current flowing through the second write word line WWL2, the second read word line RWL2, the second bit line BL2, and the second sensing line SL2.

Figure 15:
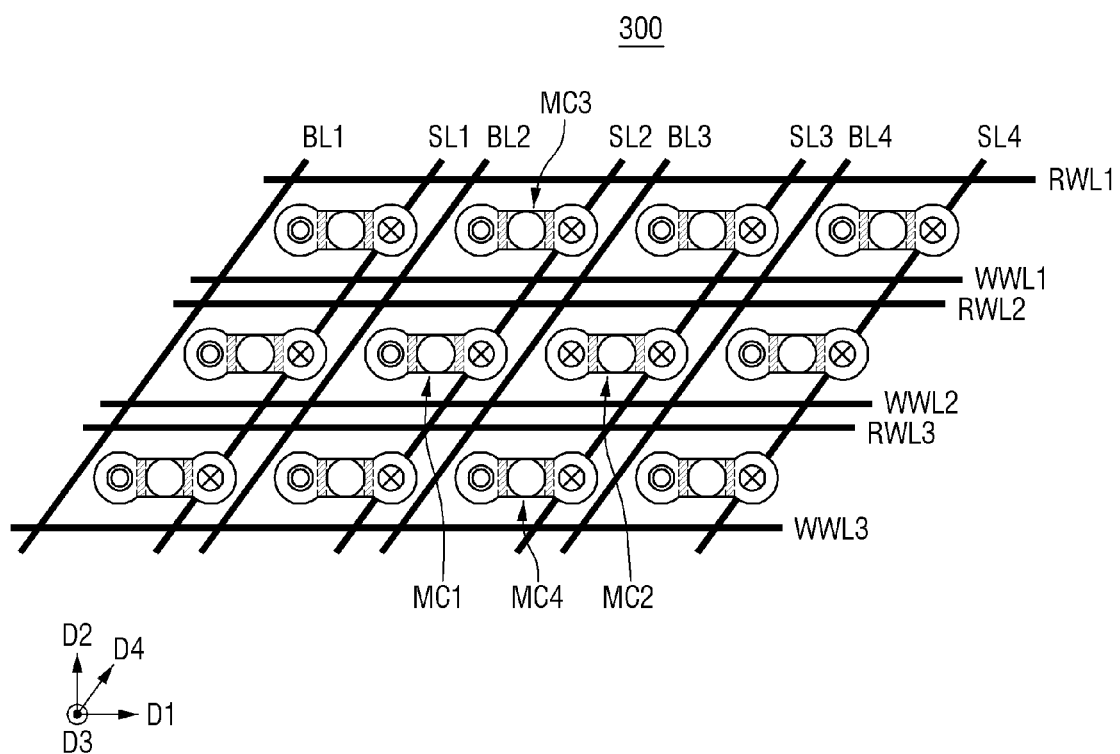
FIGS. 15 and 16 are plan views for explaining a method of initializing the memory device according to an embodiment of the inventive concept.
Figure 16:
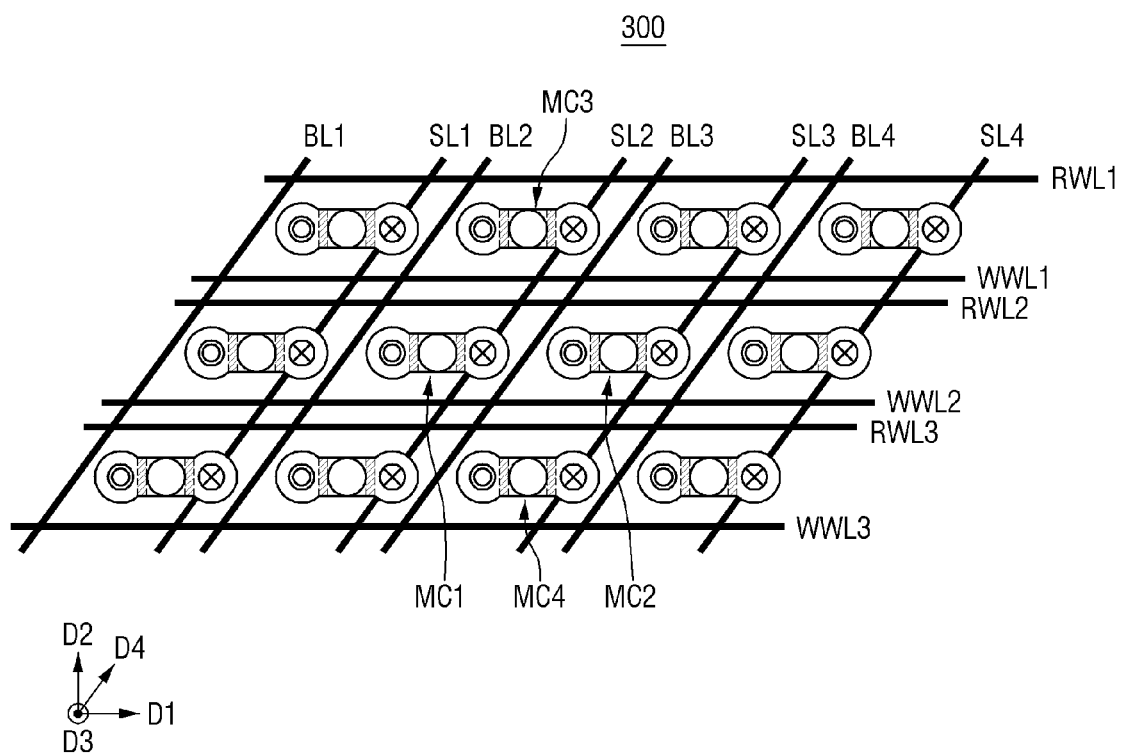

FIGS. 15 and 16 are plan views for explaining a method of initializing the memory device according to an embodiment of the disclosure.

Referring to FIG. 15, the magnetization direction of the first magnetic domain MD1 of the second memory cell MC2, and the magnetization direction of the third magnetic domain MD3 of the second memory cell MC2 are parallel to each other. For example, the magnetization direction of the first magnetic domain MD1 of the second memory cell MC2 and the magnetization direction of the third magnetic domain MD3 of the second memory cell MC2 may be directions opposite to the third direction D3. That is, since the magnetization direction of the first magnetic domain MD1 and the magnetization direction of the third magnetic domain MD3 of the second memory cell MC2 in FIG. 15 are parallel to each other, a problem may occur in the memory cell array 300.

Referring to FIG. 16, an external magnetic field processing step may be performed on the memory cell array 300. When the plurality of memory cells MC1, MC2, MC3, and MC4 of the memory cell array 300 are placed as described referring to FIGS. 1 to 14, the second memory cell MC2 may be subjected to a bipolar interaction due to other memory cells MC1, MC3, and MC4. As a result, the magnetization direction of the first magnetic domain MD1 of the second memory cell MC2 may be anti-parallel to the other magnetic domains surrounding the first magnetic domain MD1. That is, the magnetization direction of the first magnetic domain MD1 of the second memory cell MC2 and the magnetization direction of the third magnetic domain MD3 of the second memory cell MC2 may be anti-parallel to each other. Therefore, the reliability of the nonvolatile memory 200 including the initialized memory cells MC1, MC2, MC3, and MC4 may be further improved.

Hereinafter, a method of initializing the memory cell array 300 according to an embodiment of the disclosure will be described referring to FIGS. 17 to 20.

Figure 17:
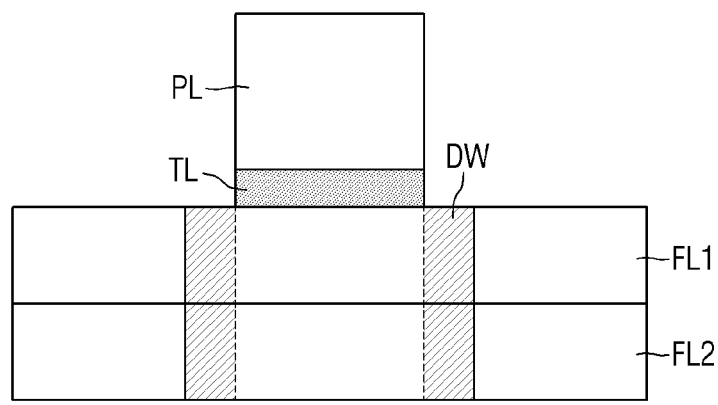
FIG. 17 is a front view for explaining a memory cell according to an embodiment of the inventive concept.
Figure 17:
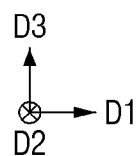
Figure 18:
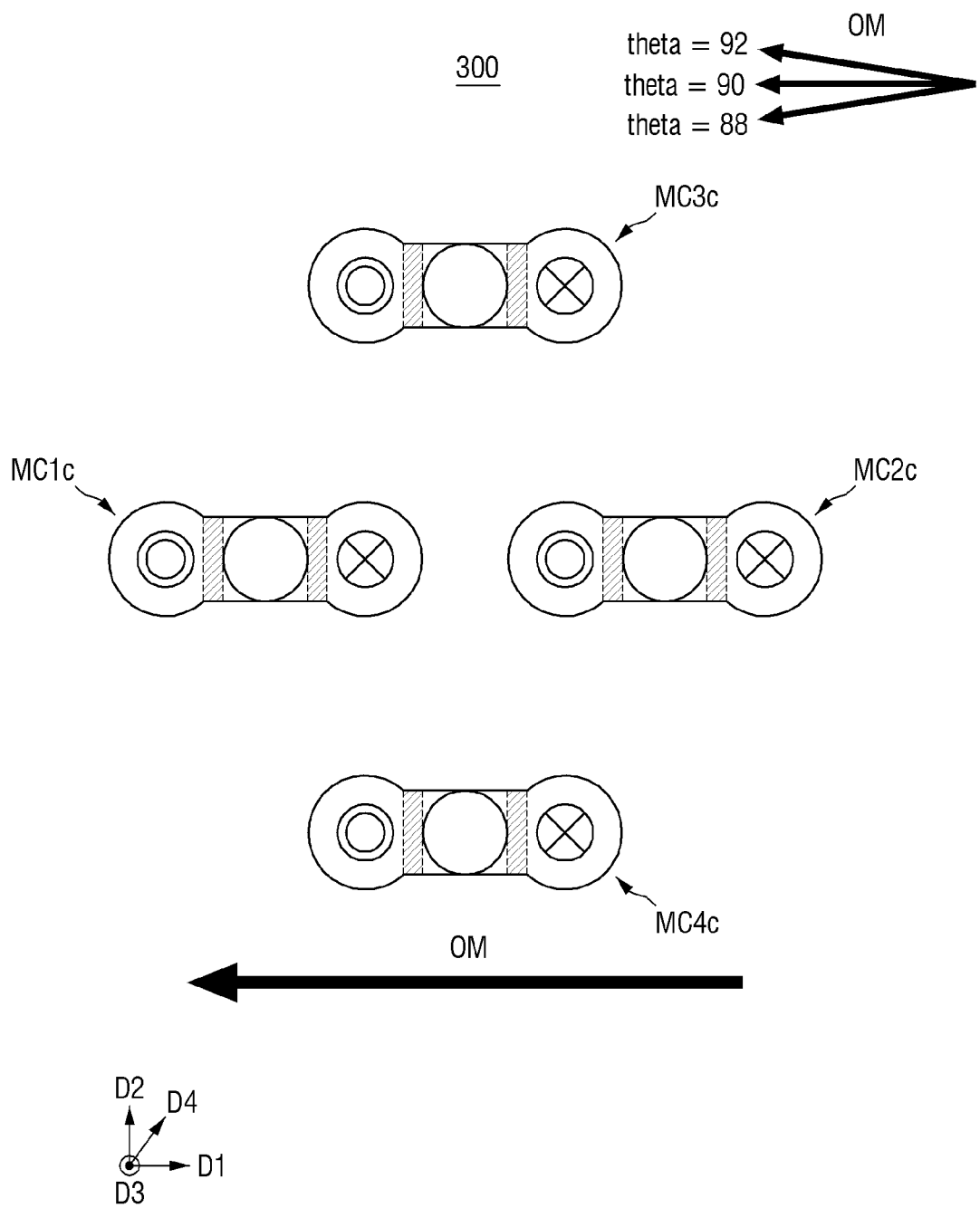
FIGS. 18 to 20 are diagrams for explaining the method of initializing memory cell according to an embodiment of the inventive concept.
Figure 19:
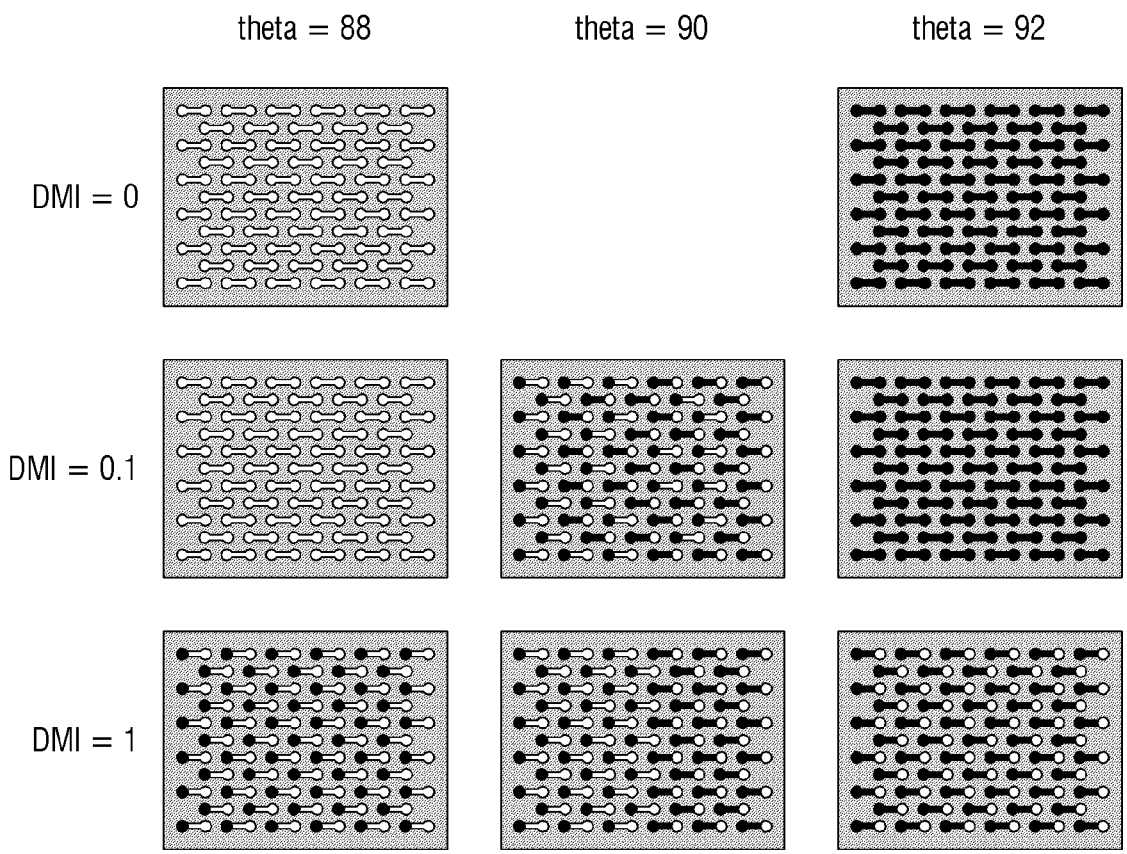
Figure 20:
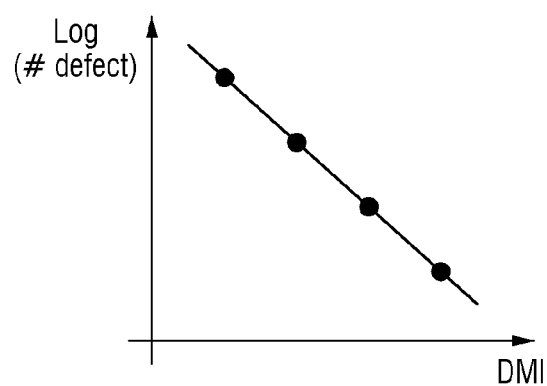

FIG. 17 is a front view for explaining a memory cell according to an embodiment of the disclosure. FIGS. 18 to 20 are diagrams for explaining the method of initializing memory cell according to some embodiments. For convenience of explanation, repeated parts of contents explained using FIGS. 1 to 16 will be briefly explained or omitted.

Referring to FIG. 17, a first memory cell MC1c may include a pinned layer PL, a tunnel barrier pattern TL, a first magnetic layer FL1, and a second magnetic layer FL2. The first magnetic layer FL1 may be stacked on the second magnetic layer FL2, and the pinned layer PL may be stacked on the first magnetic layer FL1. The tunnel barrier pattern TL may be formed between the pinned layer PL and the first magnetic layer FL1. For example, a bottom surface of the tunnel barrier pattern TL may contact an upper surface of the first magnetic layer and an upper surface of the tunnel barrier pattern TL may contact a bottom surface of the pinned layer PL.

Here, the second magnetic layer FL2 may include a heavy metal material. For example, the second magnetic layer FL2 may include tungsten (W) or platinum (Pt). In an embodiment, the material that makes up the second magnetic layer FL2 is different from the material that makes up the first magnetic layer FL1. Since the magnetic layer is made up of the first magnetic layer FL1 and the second magnetic layer FL2 including different materials from each other, a Dzyaloshinskii-moriya interaction (DMI) of the magnetic layer may be further increased. The Dzyaloshinskii-moriya interaction may also be referred to as an asymmetric exchange interaction. For example, the Dzyaloshinskii-moriya interaction of the magnetic layer may be measured to be 0.1 erg/cm$^2$ or more. However, embodiments of the present disclosure are not limited thereto, and the Dzyaloshinskii-moriya interaction of the magnetic layer may be measured to be 1 erg/cm$^2$ or more. When the Dzyaloshinskii-moriya interaction of the magnetic layer increases, the performance of the initialization method of the memory cell array 300 including the first memory cell MC1c may be further improved.

Referring to FIG. 18, an external magnetic field OM is applied to the memory cell array 300 including the first memory cell MC1c. Here, the second memory cell MC2c, the third memory cell MC3c, the fourth memory cell MC4c, and the other memory cells may have the same shape and configuration as those of the first memory cell MC1c explained referring to FIG. 17.

The plurality of memory cells MC1c, MC2c, MC3c, and MC4c may extend in the first direction D1. In an embodiment, the external magnetic field OM is applied in a direction opposite to the first direction D1. In this case, an angle (theta) of the external magnetic field OM may be about, around, or exactly 90 degrees. However, embodiments of the present disclosure are not limited thereto, and an angle (theta) of the external magnetic field OM may differ from 90 degrees. For example, the angle (theta) of the external magnetic field OM may be 88 degrees or the angle (theta) of the external magnetic field OM may be 92 degrees. That is, the external magnetic field OM may be parallel to the first direction D1, but may have a slight angle difference from the first direction D1.

Referring to FIGS. 19 to 20, the Dzyaloshinskii-moriya interaction of the magnetic layers of the plurality of memory cells MC1c, MC2c, MC3c, and MC4c is 0 erg/cm$^2$, the magnetization direction of the first magnetic domain MD1 and the magnetization direction of the third magnetic domain MD3 of the plurality of memory cells MC1c, MC2c, MC3c, and MC4c may be parallel to each other. That is, even after initialization by the external magnetic field OM, the magnetization directions of the first magnetic domain MD1 and the magnetization directions of the third magnetic domain MD3 of the plurality of memory cells MC1c, MC2c, MC3c, and MC4c may not be anti-parallel to each other.

When the Dzyaloshinskii-moriya interaction of the magnetic layer of the plurality of memory cells MC1c, MC2c, MC3c, and MC4c is 0.1 erg/cm² and the angle (theta) of the external magnetic field OM is 90 degrees, the magnetization direction of the first magnetic domain MD1 and the magnetization direction of the third magnetic domain MD3 of the plurality of memory cells MC1c, MC2c, MC3c, and MC4c may be anti-parallel to each other. However, when the angle (theta) of the external magnetic field OM is 88 degrees or 92 degrees, the magnetization direction of the first magnetic domain MD1 and the magnetization direction of the third magnetic domain MD3 of the plurality of memory cells MC1c, MC2c, MC3c, and MC4c may not be anti-parallel to each other.

When the Dzyaloshinskii-moriya interaction of the magnetic layer of the plurality of memory cells MC1c, MC2c, MC3c, and MC4c is 1 erg/cm², the magnetization direction of the first magnetic domain MD1 and the magnetization direction of the third magnetic domain MD3 of the plurality of memory cells MC1c, MC2c, MC3c, and MC4c may be anti-parallel to each other. At this time, even when the angle (theta) of the external magnetic field OM is 88 degrees or 92 degrees, the magnetization direction of the first magnetic domain MD1 and the magnetization direction of the third magnetic domain MD3 of the plurality of memory cells MC1c, MC2c, MC3c, and MC4c may be anti-parallel to each other. That is, as the Dzyaloshinskii-moriya interaction of the magnetic layer increases as in FIG. 20, the number of defective memory cells MC1c, MC2c, MC3c, and MC4c may be reduced. That is, as the Dzyaloshinskii-moriya interaction of the magnetic layer of the memory cells MC1c, MC2c, MC3c, and MC4c increases, the performance of the memory cell array 300 due to the initialization action of the external magnetic field OM may be improved.

In concluding the detailed description, those of ordinary skill in the art will appreciate that many variations and modifications may be made to the embodiments described above without substantially departing from the principles of the present disclosure.

What is claimed is:

1. A magnetic memory device comprising:
a first magnetic memory cell extending in a first direction, including a first pinned layer, a first magnetic domain and a second magnetic domain arranged in the first direction, wherein the first pinned layer is arranged without overlapping the first and second magnetic domains; and
a second magnetic memory cell extending in the first direction, including a second pinned layer, a third magnetic domain and a fourth magnetic domain arranged in the first direction, wherein the second pinned layer is arranged without overlapping the third and fourth magnetic domains,
wherein a magnetization direction of the first magnetic domain and a magnetization direction of the second magnetic domain are anti-parallel to each other,
wherein a magnetization direction of the third magnetic domain and a magnetization direction of the fourth magnetic domain are anti-parallel to each other, and
wherein the third magnetic domain of the second magnetic memory cell is spaced apart from the second magnetic domain of the first magnetic memory cell in a second direction intersecting the first direction.

2. The magnetic memory device of claim 1, wherein the magnetization direction of the second magnetic domain and the magnetization direction of the third magnetic domain are anti-parallel to each other.

3. A magnetic memory comprising:
a first magnetic memory cell extending in a first direction, and including a first magnetic domain and a second magnetic domain arranged in the first direction; and
a second magnetic memory cell extending in the first direction, and including a third magnetic domain and a fourth magnetic domain arranged in the first direction,
wherein a magnetization direction of the first magnetic domain and a magnetization direction of the second magnetic domain are anti-parallel to each other,
wherein a magnetization direction of the third magnetic domain and a magnetization direction of the fourth magnetic domain are anti-parallel to each other, and
wherein the third magnetic domain of the second magnetic memory cell is spaced apart from the second magnetic domain of the first magnetic memory cell in a second direction intersecting the first direction,
wherein a first distance between the first magnetic domain and the second magnetic domain is the same as a second distance between the second magnetic domain and the third magnetic domain.

4. The magnetic memory device of claim 1, further comprising: a third magnetic memory cell spaced apart from the first magnetic memory cell in the first direction and extending in the first direction, the third magnetic memory cell including a fifth magnetic domain and a sixth magnetic domain arranged in the first direction.

5. The magnetic memory device of claim 4, wherein the fourth magnetic domain of the second magnetic memory cell is spaced apart from the fifth magnetic domain of the third magnetic memory cell in the second direction, and the magnetization direction of the fourth magnetic domain and the magnetization direction of the fifth magnetic domain are anti-parallel to each other.

6. The magnetic memory device of claim 5, wherein a first distance between the first magnetic domain and the second magnetic domain is the same as a second distance between the second magnetic domain and the fifth magnetic domain.

7. The magnetic memory device of claim 1, further comprising:
a fourth magnetic memory cell spaced apart from the first magnetic memory cell in a direction opposite to the second direction and extends in the first direction, the fourth magnetic memory cell including a seventh magnetic domain and an eighth magnetic domain arranged in the first direction.

8. The magnetic memory device of claim 7, wherein the seventh magnetic domain of the fourth magnetic memory cell is spaced apart from the second magnetic domain of the first magnetic memory cell in a direction opposite to the second direction, and the magnetization direction of the second magnetic domain and the magnetization direction of the seventh magnetic domain are anti-parallel to each other.

9. The magnetic memory device of claim 8, wherein a first distance between the first magnetic domain and the second magnetic section is the same as a second distance between the second magnetic domain and the seventh magnetic domain.

10. The magnetic memory device of claim 1, wherein the second magnetic memory cell is spaced apart from the first magnetic memory cell in a third direction forming a first acute angle with the first direction and forming a second acute angle with the second direction.

11. The magnetic memory device of claim 10, wherein the fourth magnetic domain is spaced apart from the second magnetic domain in the third direction.

12. The magnetic memory device of claim 1, wherein the first magnetic memory cell includes a first magnetic domain wall defined between the first and second magnetic domains, and the second magnetic memory cell includes a second magnetic domain wall defined between the third and fourth magnetic domains.

13. A magnetic memory device comprising:
a first word line extending in a first direction;
a second word line spaced apart from the first word line in a second direction intersecting the first direction, and extending in the first direction;
a first bit line intersecting the first word line and the second word line, and extending in a third direction forming a first acute angle with the first direction and forming a second acute angle with the second direction; and
a first magnetic memory cell connected to the first word line, the second word line, and the first bit line,
wherein the first magnetic memory cell comprises: a first magnetic layer arranged in the first direction, and including a first magnetic domain and a second magnetic domain having magnetization directions anti-parallel with each other, and a first pinned layer disposed on the first magnetic layer, wherein the first magnetic domain is connected to the first word line through a first transistor, the second magnetic domain is connected to the first bit line, and the first pinned layer is connected to the second word line through a second transistor.

14. The magnetic memory device of claim 13, further comprising: a second bit line intersecting the first word line and the second word line, extending in the third direction, and spaced apart from the first bit line.

15. The magnetic memory device of claim 14, wherein the second bit line is connected to the first magnetic domain through the first transistor and connected to the first pinned layer through the second transistor.

16. The magnetic memory device of claim 13, further comprising:
a third word line spaced apart from the second word line in the second direction and extending in the first direction;
a fourth word line spaced apart from the third word line in the second direction and extending in the first direction; and a second magnetic memory cell connected to the third word line, the fourth word line, and the first bit line,
wherein the second magnetic memory cell comprises: a second magnetic layer arranged in the first direction and including a third magnetic domain and a fourth magnetic domain having magnetization directions anti-parallel to each other, and a second pinned layer disposed on the second magnetic layer, wherein the third magnetic domain is connected to the third word line through a third transistor, the fourth magnetic domain is connected to the first bit line, and the second pinned layer is connected to the fourth word line through a fourth transistor.

17. The magnetic memory device of claim 16, wherein the third magnetic domain is spaced apart from the second magnetic domain in the second direction, and the magnetization direction of the second magnetic domain and the magnetization direction of the third magnetic domain are anti-parallel to each other.

18. A magnetic memory device comprising:
a magnetic layer extending in a first direction and including a first sub-magnetic layer and a second sub-magnetic layer sequentially stacked; and
a pinned layer disposed on the magnetic layer, wherein the first sub-magnetic layer includes a first magnetic domain and a second magnetic domain arranged in the first direction,
wherein the second sub-magnetic layer includes a third magnetic domain and a fourth magnetic domain arranged in the first direction, and a Dzyaloshinskii-moriya interaction (DMI) of the magnetic layer is 0.1 erg/cm$^2$ or more.

19. The magnetic memory device of claim 18, wherein the second sub-magnetic layer is disposed on the first sub-magnetic layer, wherein the pinned layer is disposed on the second sub-magnetic layer, and wherein the first sub-magnetic layer includes a heavy metal material.

20. The magnetic memory device of claim 18, wherein the Dzyaloshinskii-moriya interaction of the magnetic layer is 1 erg/cm$^2$ or more.

* * * * *